United States Patent
Landolt

(10) Patent No.: US 9,952,256 B2
(45) Date of Patent: Apr. 24, 2018

(54) MATCHING CIRCUIT FOR MATCHING AN IMPEDANCE VALUE AND A CORRESPONDING SYSTEM AND METHOD

(71) Applicant: Rohde & Schwarz GmbH & Co. KG, Munich (DE)

(72) Inventor: Oliver Landolt, Taufkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 329 days.

(21) Appl. No.: 14/635,579

(22) Filed: Mar. 2, 2015

(65) Prior Publication Data
US 2016/0156336 A1    Jun. 2, 2016

(30) Foreign Application Priority Data

Dec. 2, 2014 (DE) .................. 10 2014 224 620
Dec. 10, 2014 (DE) .................. 10 2014 225 395

(51) Int. Cl.
*G01R 13/02* (2006.01)
*G01R 13/22* (2006.01)
*H03H 7/38* (2006.01)

(52) U.S. Cl.
CPC ............. *G01R 13/225* (2013.01); *H03H 7/38* (2013.01); *H03H 7/383* (2013.01)

(58) Field of Classification Search
CPC ......... G01R 13/225; H03H 7/38; H03H 7/383
USPC ........................................................ 702/67
See application file for complete search history.

(56) References Cited

U.S. PATENT DOCUMENTS

2015/0109005 A1* 4/2015 Hernandez ........... G01R 1/0416
324/691

FOREIGN PATENT DOCUMENTS

| DE | 102005058875 A1 | 6/2007 |
| DE | 112008000069 T5 | 11/2009 |
| DE | 112009001878 T5 | 7/2011 |

OTHER PUBLICATIONS

Impedance Matching, Iulian Rosu; http://www.qsl.net/va3iul/, all pages.*
Impedance Matching Networks, Iulian Rosu; http://www.qsl.net/va3iul/, all pages.*
Tranmission line—Wikipedia: https://en.wikipedia.org/wiki/transmission_line; all pages.*

* cited by examiner

*Primary Examiner* — Fernando Hidalgo
(74) *Attorney, Agent, or Firm* — Ditthavong & Steiner, P.C.

(57) ABSTRACT

The invention relates to a matching circuit for matching impedance values comprising an impedance element with an impedance value, which corresponds to a required total impedance value of the matching circuit, a structurally determined parasitic unit with a parasitic impedance value and a compensation unit with at least one first compensation element. The first compensation element provides a compensation impedance value which is the dual impedance value of the parasitic impedance value. Furthermore, a system comprising a first circuit unit and a second circuit unit with a matching circuit serving for the matching is provided. Also, a method for the compensation of parasitic units for matching purposes is provided.

14 Claims, 5 Drawing Sheets

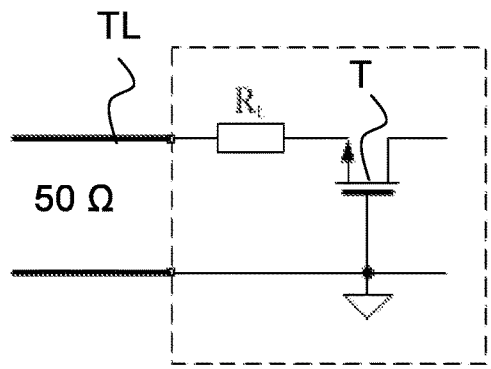
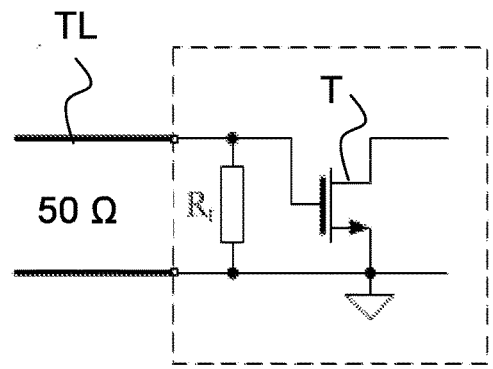
Fig. 1a                    Fig. 1b
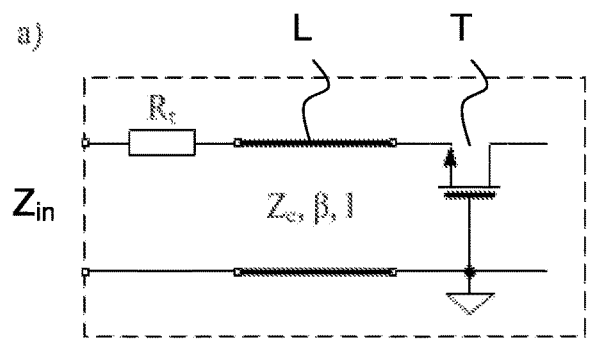
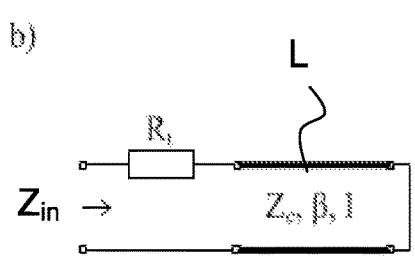
Fig. 2a                    Fig. 2b

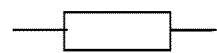
R
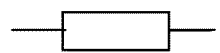
$R_T^2/R$
Fig. 9a
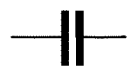
C
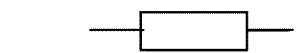
$R_T^2 \cdot C$
Fig. 9b
L
$L/R_T^2$
Fig. 9c
V
$V/R_T$
Fig. 9d
I
$R_T \cdot I$
Fig. 9e
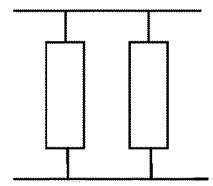
Fig. 9f
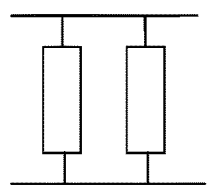
Fig. 9g
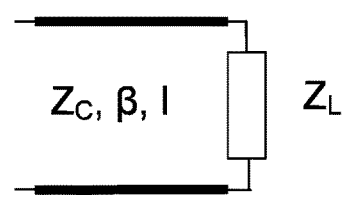
$Z_C, \beta, l$    $Z_L$
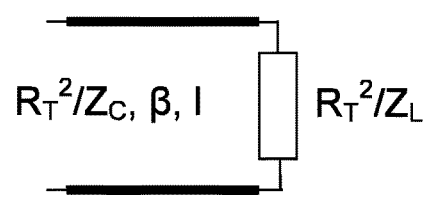
$R_T^2/Z_C, \beta, l$    $R_T^2/Z_L$
Fig. 9h

MATCHING CIRCUIT FOR MATCHING AN IMPEDANCE VALUE AND A CORRESPONDING SYSTEM AND METHOD

CROSS-REFERENCE TO RELATED APPLICATION

The present application claims priority to German patent applications DE 10 2014 224 620.2 filed Dec. 2, 2014 and DE 10 2014 225 395.0 filed Dec. 10, 2014, the entire contents of which are herein incorporated by reference.

FIELD OF THE INVENTION

The invention, according to various embodiments described herein, relates to a matching circuit for matching an impedance value, a system and a method for compensating parasitic units for matching purposes.

DISCUSSION OF THE BACKGROUND

A matching circuit is understood in electrical engineering as a circuit arrangement which allows the matching of an electrical signal value, for example, a current, a voltage and/or a power, to given conditions, for example, to an input condition, an output condition and/or a transmission condition within circuits and/or between circuit units. Given conditions are especially an impedance value, a resistance value, and inductance value and/or a capacitance value of an electrical circuit unit.

In particular, different circuit units are coupled with one another through matching circuits, wherein the transmission of the electrical signal value is significantly influenced through the use of the matching circuit. The relationship of an output condition of an energy-supplying circuit unit to the input condition of a circuit unit downstream of the latter is decisive for the embodiment of the matching circuit.

If the output condition, for example, the output impedance of the energy-supplying circuit unit, and the input condition, for example, the input impedance of the subsequent circuit unit, are of identical magnitude, reflection matching and power matching is present. In this case, the transmission pathway comprising, for example, an energy-supply circuit unit and a subsequent circuit unit, is homogenous and no reflection of the electrical signal value, especially the blind component of the signal value, occurs at the output respectively the input of the circuit units. Especially in high-frequency technology and in communications technology, it is often required that circuit units must be matched in a reflection-free manner, wherein a power matching is also required, at least indirectly.

Electrical signals with very high frequencies are regarded as electromagnetic waves. Such signals are transmitted from point to point via transmission lines, wherein the lines are characterized by their length, their propagation constant β and their line impedance $Z_c$. The line impedance of a transmission line is regarded as a pure ohmic resistance if no substantial losses are present. Ideally, the endpoint of a transmission line is terminated with an ohmic resistance element, wherein the resistance value is identical to the ohmic resistance value of the characteristic impedance $Z_c$ of the line. In the case of non-ideal matching of the output of the transmission line, a part of the electrical signal is reflected back from the output of the line to the input of the line. Such reflections generate ripples in the magnitude of the frequency response of the overall transmission path, since the magnitude of the frequency response is dependent upon the line conditions at both ends of the transmission line.

For measuring instruments, for example, oscilloscopes or spectrum analyzers, which are supposed to register high-frequency signal values, it is important that a high precision input impedance is present at the input of the measuring instrument, wherein the input impedance must be independent of the input signal. Reflections at the input of the measuring instrument must absolutely be prevented to avoid causing a distortion of the electrical signal. The input impedance for signal values with frequencies from DC up to very high frequencies must therefore be a purely resistive impedance in order to prevent such ripples in the magnitude of the frequency response.

Such ripples of the magnitude lead to undesired frequency-dependent measurement errors which can seriously falsify the amplitudes of the input signal to be registered.

Such ripples of the magnitude cannot simply be calibrated out, because, for example, the line length and the propagation constant β of the line, as substantial factors for the fluctuations, are located outside the control of a measuring instrument.

FIG. 1a and FIG. 1b illustrate the input of a measuring instrument with an exemplary high-frequency transistor in simplified form. Typically, a series resistance element $R_T$ connected to a virtual ground point is used for inputs to a measuring instrument, see FIG. 1a or a parallel resistance element $R_T$ is used at the input, see FIG. 1b.

Even if the ohmic resistance element $R_T$ is embodied very precisely, the input impedance varies with frequency of the electrical input signal because of parasitic inductances or parasitic capacitances of the transistor or of the resistance element $R_T$ itself. The connecting elements between resistor and transistor also trigger such parasitic effects.

The effect of parasitic units based on the connecting elements is particularly problematic when the input transistor is embodied on a semiconductor substrate, while the resistance element $R_T$ is to be arranged outside this semiconductor substrate, for example, because of space requirements, interference coupling requirements or heat removal specifications. Even if the resistance element $R_T$ were to be embodied on the semiconductor substrate, the considerable tolerances from 10 to 15% which might be expected with resistance elements embodied in this manner would make a use in the field of measurement technology impossible. Furthermore, such resistance elements are susceptible to electrostatic discharge processes and/or current/voltage peaks of the input signal. Furthermore, such resistance elements are strongly temperature dependent. Furthermore, such resistance elements form a large parasitic capacitance on the semiconductor substrate. For these reasons, such resistance elements cannot be used as a terminating element respectively matching element for a high-precision measuring instrument in high-frequency technology.

Consequently, it is not possible to dispense with the use of non-ideal resistance elements as matching elements. It is therefore desirable to optimize a non-ideal input resistance of a measuring instrument by means of a matching circuit in such a manner that a purely ohmic effect with a very constant resistance value is obtained for all input frequencies.

A great many matching circuits which can be used for various circuit units are known from the prior art. In this context, a merely narrow-band matching circuit, which achieves a matching of the matching element only in the immediate proximity of the operating frequency of the high-frequency circuit, is conventional for high-frequency applications. Such a matching circuit can be achieved for an arbitrary impedance value, for example, through a global arrangement of inductances or capacitances as a compensation element or through an additional stub in the transmission line. Such a matching circuit is calculated in an ideal manner for a single frequency. A deviation from this frequency during operation automatically leads to an error-matched circuit unit because of the deviating impedance values occurring.

A different approach to the solution for the above named problem is the use of a so-called tapered transmission line. In microstrip lines, the characteristic impedance is dependent upon the width of the transmission lines. If a source with a given impedance, for example 75 ohms, must be matched with another impedance value, for example, 50 ohms, a microstrip line of which the width tapers stepwise from a first width to a second width can be used. The first width causes an impedance value of 75 ohms, whereas the second width causes an impedance value of 50 ohms. In the case of high-frequency alternating signals, a better matching is achieved in this manner than, for example, merely a change in width. These tapered transmission lines can accordingly be controlled in an adequate, if not actually perfect manner for every required bandwidth, in order to achieve an ideal matching for the given conditions. In this context, the operating frequency range in which the transmission line is to be matched as ideally as possible, is substantially enlarged. However, good impedance matching in the lower frequency range and especially for direct signals is not possible with such matching circuits.

All of the methods previously described for the solution of this problem can be used only for lossless matching circuits subject to the specification that a power transmission is to be maximized in order to transmit a signal from an energy-supply circuit unit to a downstream circuit unit.

By contrast, if the purpose of a matching circuit is to eliminate ripples due to reflections at the output of a transmission line caused by impedance mismatch, it is acceptable that a part of the energy does not arrive in the receiver.

One solution for the problem named above is the use of a broadband attenuation element in series configurations to the input of the circuit unit, for example, a measuring instrument. In this context, the incoming wave of the input signal is attenuated by this attenuator. The reflected wave resulting from the error matching is attenuated again on the return path by the same attenuator. The incoming wave and the reflected wave are superposed. As a result, the reflected wave obtained is reduced by twice the attenuation factor of the attenuator on a logarithmic scale in decibels. The disadvantage of this solution is that the input signal is attenuated, which leads to a deterioration of the signal-noise ratio.

SUMMARY OF THE INVENTION

According to one embodiment, a matching element, a system and a method which overcomes at least the problems mentioned above, is provided. The matching element may be embodied with a broad bandwidth. With the matching circuit, it is possible to match every type of circuit unit to a downstream circuit unit. It is also possible to use this matching circuit especially in high-frequency applications and with the use of transmission lines as circuit units.

According to one embodiment, a matching circuit for matching an impedance value is provided. For this purpose, the matching circuit may provide an impedance element with an impedance value, wherein the impedance value corresponds to a required total impedance value of the matching circuit. Furthermore, a structurally determined parasitic unit may be contained in the matching circuit, wherein the parasitic unit provides a parasitic impedance value. Furthermore, a compensation unit with at least one first compensation element may be provided in the matching circuit, wherein the first compensation element provides a compensation impedance value, which is the dual impedance value of the parasitic impedance value.

The required total impedance value of the impedance element may be, in particular, the theoretical value which the matching circuit as a whole must provide in order to allow an ideal matching of a first circuit unit to a downstream circuit unit. The required total impedance value accordingly corresponds to the impedance value of the non-ideal impedance element introduced in the matching circuit.

The structurally determined parasitic unit may be a unit present on the basis of the topology of the matching circuit, which provides, in particular, parasitic elements, such as inductance elements, capacitance elements and/or ohmic resistances. The aim is to compensate such a structurally determined parasitic unit. Only through compensation of these structurally determined parasitic units can a matching circuit provide a required total impedance value for all frequencies. A structurally determined parasitic unit may be, for example, the line inductance and/or line capacitance of a wiring element; the capacitance and/or inductance of a ball-grid array (English: ball-grid array) for contacting the transmission line to the downstream circuit unit; and/or further parasitic elements based on coupling effects between the transmission line and surrounding elements.

The compensation unit may be provided for the compensation of the structurally determined parasitic unit. The compensation unit provides a dual impedance value which corresponds to the parasitic impedance value.

The dual impedance value may be an impedance value which is obtained in an impedance element through the exchange of current and voltage. An impedance value of the compensation unit may be then dual relative to an impedance value of the parasitic unit, if the voltage-current characteristic is retained structurally in the case of an exchange of voltage and current. A duality impedance of the parasitic impedance may be, for example, the parasitic admittance, that is, for example, the reciprocal value of the parasitic impedance value. The dual impedance of an ohmic resistance may be, for example, an ohmic conductance.

The embodiment of the compensation unit with a dual impedance value means that the parasitic impedance value may be completely compensated, so that, as a result, the required total impedance value may be obtained as the single active element of the matching circuit. Accordingly, the matching circuit is frequency independent and also temperature stable.

According to one embodiment, the invention is based upon the idea that parasitic elements of an impedance value required—for matching purposes—may be compensated by means of a dual compensation unit, so that the actually required impedance value acts as a matching circuit, while the remaining parasitic and compensating components have no influence on the electrical signal.

The compensation unit may provide a second compensation element, wherein the second compensation element provides an impedance value which corresponds to the required total impedance value. The introduction of this second compensation element allows a complete elimination of parasitic effects to be achieved through the construction of a dual compensation unit comprising a first compensation element for the compensation of the parasitic unit and the second compensation element.

In one embodiment, the impedance element is arranged in series configuration with the parasitic unit. In this case, the compensation unit may be arranged in parallel configuration to this series configuration. This embodiment serves in particular for the compensation of a parasitic unit of a series impedance element. Because of the embodiment of the compensation unit with a dual impedance value and the parallel connection of this compensation unit to the series configuration, a dual circuit which completely compensates the frequency dependence and temperature dependence of the parasitic unit is introduced into the signal path.

In this context, the compensation unit may be a series configuration comprising the first compensation element and the second compensation element.

In an alternative embodiment, the impedance element may be arranged in parallel configuration with the parasitic unit. The compensation unit may be arranged in series configuration to this parallel configuration. This embodiment serves especially for the compensation of a parasitic unit of a parallel impedance element.

The compensation unit may be a parallel configuration comprising the first compensation element and the second compensation element. Here also, the embodiment may be achieved in a dual network to the parasitic unit, so that the elimination of the parasitic effects takes place on the basis of the parasitic unit.

The dual configuration of a series-connected circuit element may be a parallel configuration comprising the dual circuit elements. This also applies vice versa. According to one embodiment, the individual elements of the circuit may be expressed through dual impedances. Accordingly, the parasitic unit can be completely eliminated on the basis of the dual arrangement and use of dual impedance values of the compensation unit, so that, for the input signal, only the required impedance element with the required total impedance value is present in the matching circuit as an active element. The required total impedance value may then be frequency independent and temperature stable.

In one embodiment the dual impedance value of the first compensation element may be referenced to the required impedance value. This achieves a scaling to the dual value.

In another embodiment, the dual impedance value of the first compensation element may equal to the quotient of the square of the impedance value and the parasitic impedance value. The admittance may be accordingly adjusted as a compensation value which counteracts the impedance value as a dual element.

In a preferred embodiment, the impedance element may be a resistance element, especially with an impedance value of 50 ohms. With such an ohmic impedance element, a matching to systems comprising currently available input units respectively output units is possible in a simplified manner.

In one embodiment, the parasitic unit and the first compensation element may be, respectively, a transmission line with identical propagation constant $\beta$ and identical length l. For example, if the impedance element is disposed outside of a semiconductor substrate, while the downstream circuit unit is realized on the semiconductor substrate, connecting elements must be provided between the impedance element and the downstream circuit unit. These connecting elements provide a substantial length l relative to the wavelength $\lambda$ of the electrical signal, so that undesired mismatch occur.

In an idealized model, these connecting elements may be regarded as lossless transmission lines, which may be determined through a line impedance $Z_c$, a propagation constant $\beta$, a length l and a termination impedance $Z_L$. Now, in order to compensate this transmission line—provided as a connecting element —, a transmission line with identical propagation constant $\beta$ and identical length l may be provided as a compensation unit. Instead of the line impedance $Z_c$ of the connecting element, a dual impedance value to the parasitic impedance value may be selected for the transmission line of the compensation unit. Instead of the load impedance $Z_L$, the transmission line of the compensation unit may be terminated with the dual impedance value of $Z_L$.

In the case of duality in classical network theory, networks of lumped elements, especially resistors, capacitors, inductances which can be regarded as one-ports, are observed. By contrast, transmission lines are always two-ports, wherein a one-port connected to ground is observable respectively at each end of a transmission line. Two-ports cannot therefore be described through conventional duality theory. However, one-port theory can be used if a piece of transmission line is observed together with a load impedance $Z_L$ connected to the other end of the transmission line. In this case, the dual element of a transmission line with characteristic impedance $Z_C$ and with a load impedance $Z_L$ is equal to a transmission line with a characteristic impedance $R_T^2/Z_C$ with a load impedance $R_T^2/Z_L$.

By contrast, if the transmission line with characteristic impedance $Z_C$ is observed without the load impedance $Z_L$, according to a naïve application of the duality theory, an impedance $R_T^2/Z_L$ would have to be connected in parallel to a transmission line with characteristic impedance $R_T^2/Z_C$, of which the endpoint would be connected to ground. By contrast, in the case of the exchange of current and voltage required in the duality theory, such a substitution of the transmission line with characteristic impedance $Z_C$ without the load impedance $Z_L$ would not lead to the transmission line with characteristic impedance $Z_c$. Furthermore, a system comprising a first circuit unit and a second circuit unit may be provided according to one embodiment, wherein a matching circuit of the type described above is used for the electrical matching of the first circuit unit to the second circuit unit.

In particular, a device under test can be regarded as the first circuit unit, which is to be investigated by a measuring instrument as the second circuit unit. The matching circuit proposed according to one embodiment is provided in order to transmit measurement signals to be evaluated by the measuring instrument in a line-matched and reflection-matched manner.

In an advantageous embodiment, the second circuit unit and the matching circuit may be embodied as an integral component in a measuring instrument, especially a digital storage oscilloscope or spectrum analyzer. In this context, the matching circuit is frequency independent and temperature stable, thereby allowing a reflection-free matching to the device under test.

According to one embodiment, a method for compensating parasitic units is provided for matching purposes. In a first method step, the checking for the presence of a parasitic unit in series configuration or parallel configuration to an impedance element may be performed, wherein the impedance element provides a required total impedance. In a second method step, the introduction of a compensation unit may be performed corresponding to the test result, wherein, in the case of a presence of a parasitic unit in series configuration to the impedance element, the compensation unit may be arranged in parallel configuration to this series configuration. Alternatively, in the case of a presence of a parasitic unit in parallel configuration to the impedance element, the compensation unit may be arranged in series configuration to the parallel configuration. In a further method step, the repetition of the checking step may be performed, wherein, in the case of an establishment of a further parasitic element, a repetition of the placing step may be performed.

In this manner, a plurality of parasitic units can be matched in an iterative process starting from a desired impedance unit, so that each individual parasitic element/parasitic unit may be compensated unit in a frequency-stable and temperature-stable manner by a corresponding compensation.

In this context, the parasitic unit preferably provides a parasitic impedance value, wherein the compensation unit provides a first compensation element and wherein the first compensation element provides a compensation impedance value which is the dual impedance value of the parasitic impedance value.

BRIEF DESCRIPTION OF THE DRAWINGS

In the following, the invention is explained by way of example with reference to the drawings. Identical reference numbers refer to identical elements in the drawings. The individual elements may have been illustrated in an exaggerated scale or respectively in an oversimplified manner. The Figures of the drawings show:

FIG. 1a a resistance element as a matching element in series to an input transistor, according to one embodiment;

FIG. 1b a resistance element as a matching element in parallel to an input transistor, according to one embodiment;

FIG. 2a a resistance element as a matching element in series with a transmission line as connecting element to an input transistor, according to one embodiment;

FIG. 2b an equivalent circuit diagram of the circuit shown in FIG. 2a, according to one embodiment;

FIGS. 9a-h exemplary circuit elements and their corresponding dual circuit elements, according to one embodiment.

DETAILED DESCRIPTION OF THE DRAWINGS

Figure 3:
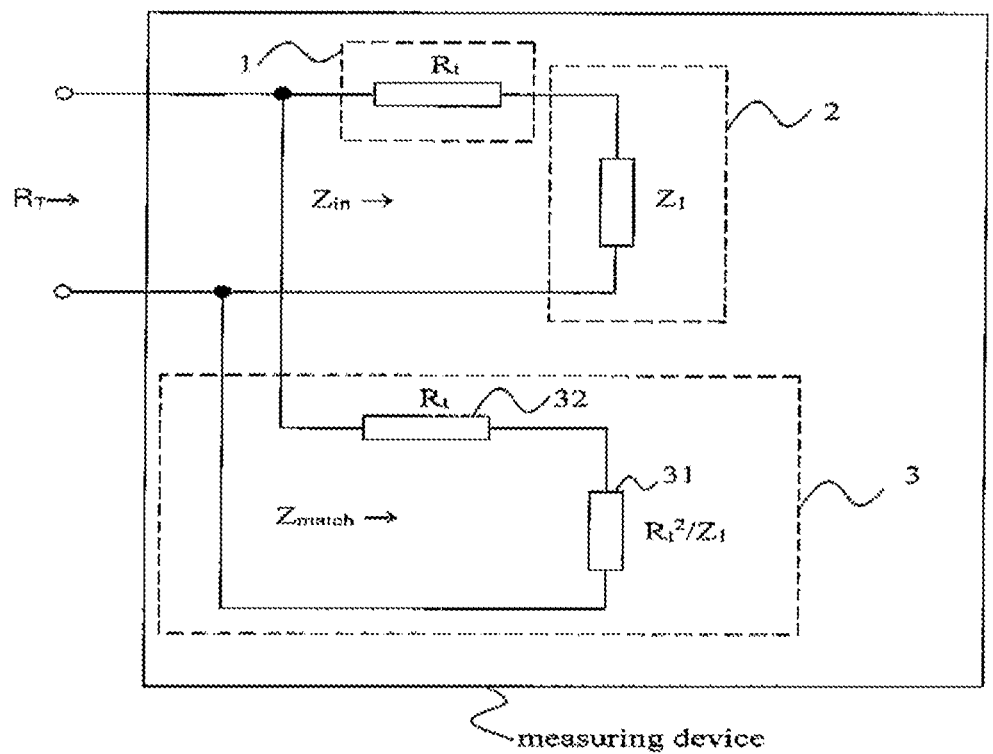
FIG. 3 a first embodiment of a matching circuit according to one embodiment.

FIG. 1a and FIG. 1b have already been described. In FIG. 1a, a transmission line TL with an impedance of $Z_C$=50 ohms is connected as a first circuit unit to a downstream second circuit arrangement. This second circuit arrangement is, for example, a measuring instrument with a measurement input, to which the transmission line TL must be connected. Now, to allow the reflection-free and power-matched transmission of high-frequency signals from the transmission line TL to the measuring instrument, the line impedance value of $Z_C$=50 ohms must be compensated. This takes place according to FIG. 1a through a series impedance $R_T$ to an input transistor in such a manner that the series impedance $R_T$ is connected to a reference potential. This takes place according to FIG. 1b through a parallel impedance $R_T$ to an input transistor in such a manner that the parallel impedance $R_T$ is connected to a high-ohmic potential.

In both cases, such a matching element $R_T$ is not adequate, since parasitic elements are non-ideal through the connecting element between impedance $R_T$ and transistor T and also the transistors T are non-ideal in the case of input signals in the high-frequency range and cause fluctuations in the magnitude of the frequency response of the input of the second circuit unit because of their frequency dependence and temperature dependence. The frequency dependence and the temperature dependence must be compensated.

FIG. 2a shows a resistance element $R_T$ as a matching element in series with a line L as a connecting element to an input transistor T. Reference is made to the fact that, as the connecting element, the line L according to the following drawings is not the transmission line TL shown in FIGS. 1a and 1b. The line L represents a structurally determined parasitic unit 2, while the transmission line TL represents a circuit unit.

The input transistor T is connected to a series configuration comprising an impedance element $R_T$ followed by a parasitic unit 2 consisting of the line L with a line impedance $Z_C$, a propagation constant $\beta$ and a length l.

According to the equivalent circuit diagram shown in FIG. 2b of the construction from FIG. 2a, the input node of the transistor T can be regarded as a virtual reference potential. Accordingly, the resistor $R_T$ does not act alone at the input terminal, but rather, an impedance element $Z_{in}$ comprising a series configuration made from a resistance element $R_T$ and a parasitic impedance value $Z_1$ of the shorted line L acts as connecting element. The parasitic impedance value $Z_1$ at the input of the shorted line L is obtained from the following:

$$Z_1 = j \cdot Z_C \cdot \tan(\beta \cdot l). \tag{1}$$

The input impedance $Z_{in}$ is obtained on the basis of the series configuration from the following:

$$Z_{in} = R_T + Z_1. \tag{2}$$

In this context, the line L represents a structurally determined parasitic unit 2. The parasitic unit 2 is frequency dependent and temperature unstable and must therefore be compensated in order to achieve an ideal transmission behavior from DC voltage through to voltages of high-frequency. Accordingly, a compensation impedance $Z_{match}$ must be found, which achieves a temperature-independent and frequency-stable matching resistance $R_T$. In this context, the following applies:

$$R_T = \cfrac{1}{\cfrac{1}{R_T + Z_1} + \cfrac{1}{Z_{match}}} \tag{3}$$

To obtain the compensation impedance $Z_{match}$, the following therefore applies:

$$Z_{match} = R_T + \frac{R_T^2}{Z_1} \tag{4}$$

If the parasitic impedance value $Z_1$ of the shorted line L is substituted according to equation (1), the following is obtained:

$$Z_{match} = R_T - j \cdot \frac{R_T^2}{Z_C} \cdot \cot(\beta \cdot l) \tag{5}$$

Figure 4:
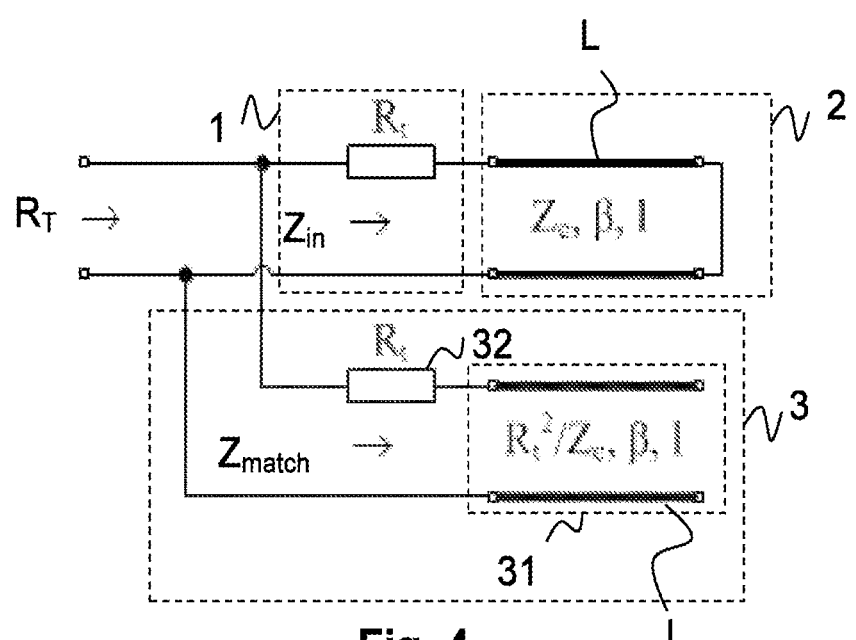
FIG. 4 a second embodiment of a matching circuit according to one embodiment.

The compensation impedance $Z_{match}$ obtained in equation (5) can be realized through a series configuration of a resistance element $R_T$ and an open-ended line L with a characteristic line impedance $R_T^2/Z_C$, a propagation constant $\beta$ and a length l, as illustrated in FIG. 4.

Initially, an explanation will be given of the general idea of the invention with reference to FIG. 3. FIG. 3 shows an impedance element 1 in series with a parasitic unit 2. Now, the parasitic unit 2 is to be completely compensated by the compensation unit 3, so that a frequency-independent and temperature stable matching circuit is obtained.

A compensation of the parasitic unit 2 is implemented through the embodiment of a dual compensation unit 3 relative to the parasitic unit 2, wherein the compensation unit 3 comprises a series configuration of a first compensation element 32 and a second compensation element 31. In this context, the second compensation element 31 is dual relative to the parasitic unit 2. Since the parasitic unit 2 is connected in series to the impedance element 1, the compensation unit 3 must be arranged in a parallel configuration to the series configuration comprising parasitic unit 2 and impedance element 1.

The compensation unit 3 according to FIG. 3 provides a first compensation element 31 in series with a second compensation element 32, thereby providing the compensation impedance $Z_{match}$. The input impedance $Z_{in}$ corresponds to equation (2). For the compensation of parasitic unit 2, a dual impedance value $R_T^2/Z_1$ relative to the parasitic impedance value $Z_1$ is formed. The dual impedance value $R_T^2/Z_1$ can be expressed through formation of the quotient of the square of the impedance value $R_T$ and the parasitic impedance value $Z_1$. This dual impedance value $R_T^2/Z_1$ is an admittance value which corresponds to the reciprocal of the parasitic impedance value $Z_1$ of the parasitic unit 2 and is scaled to the impedance value $R_T$.

The matching circuit shown in FIG. 3 causes the parasitic impedance value $Z_1$ to be compensated completely and in a frequency-independent manner by the compensation unit 3.

In FIG. 4, the shorted line L—illustrated in FIG. 2b—is compensated. In this context, the shorted line L is regarded as a parasitic unit 2. For the compensation of this parasitic unit 2, it is suggested according to FIG. 4 that an open line L with a line impedance $R_T^2/Z_C$ is used, wherein the propagation constant $\beta$ and the length l of the shorted line L are identical to the open line L.

Figure 5:
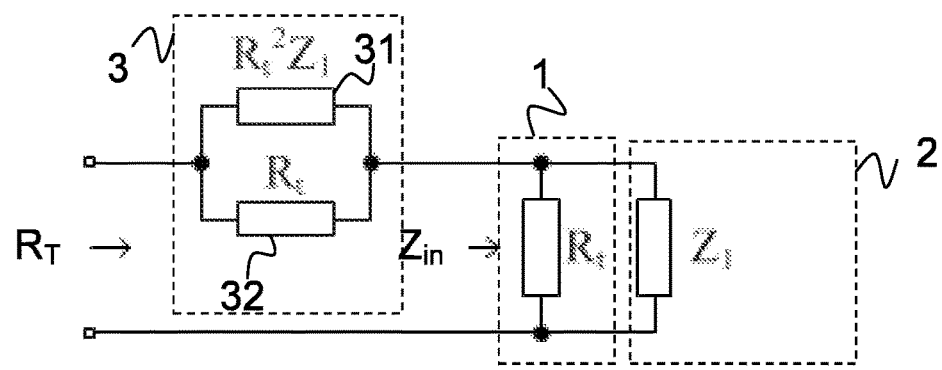
FIG. 5 a third embodiment of a matching circuit according to one embodiment.

FIG. 5 proposes a matching network which compensates the parallel configuration—shown in principle in FIG. 1b—of a resistance element $R_T$ and a parasitic unit 2 with a parasitic impedance value $Z_1$. In this context, the impedance value $R_T$ of the impedance element 1 is illustrated in parallel to the parasitic unit 2. A compensation of the parallel configuration of impedance element 1 and parasitic unit 2 is achieved by a compensation unit 3 connected in series. The compensation unit 3 provides a first compensation element 31 parallel to a second compensation element 32, wherein the second compensation element 32 provides the imped-ance value $R_T$, and the first compensation element 31 provides the dual impedance value $R_T^2/Z_1$. In this context, the following applies:

$$R_T = Z_{match} + \frac{1}{\frac{1}{R_T} + \frac{1}{Z_1}} \tag{6}$$

Now, in order to obtain the compensation impedance $Z_{match}$, the following applies $$Z_{match} = \frac{1}{\frac{1}{R_T} + \frac{Z_1}{R_T^2}} \tag{7}$$

wherein the required impedance value $R_T$ is arranged parallel to the first compensation element 31 with a dual impedance value $R_T^2/Z_1$.

Figure 6:
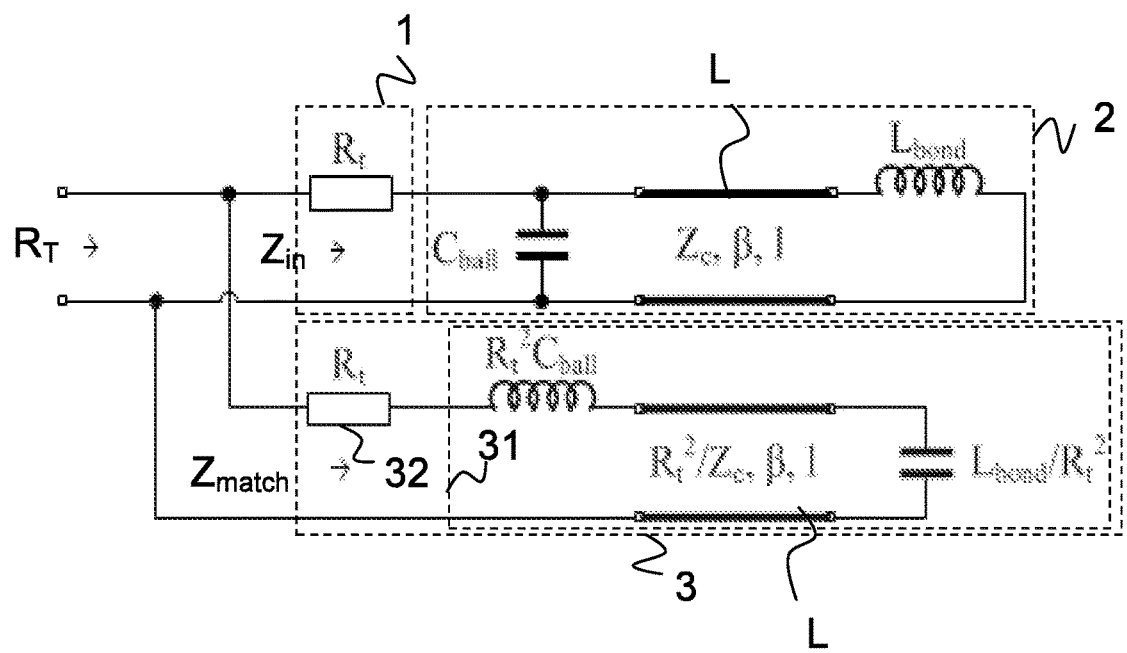
FIG. 6 a fourth embodiment of a matching circuit according to one embodiment.

FIG. 6 shows a further exemplary embodiment of a matching circuit in which a plurality of parasitic elements is introduced into a parasitic unit 2. In this context, a connecting element is embodied as the line L and, between the terminal resistor $R_T$ and a downstream transistor T—not illustrated—arranged as an input amplifier. The line L in turn is illustrated by a line shorted in a lossless manner through its line impedance $Z_C$, a propagation constant and a length l as a parasitic element of the parasitic unit 2. Furthermore, an inductance $L_{Bond}$ and a capacitance value $C_{Ball}$ are arranged as further parasitic elements in the parasitic unit 2.

According to our aspect of the invention, a compensation of all three parasitic elements comprising line L, connection capacitance $C_{Ball}$ and connection impedance $L_{Bond}$ is implemented through a compensation unit 3. The parallel-connected parasitic capacitance $C_{Ball}$ is compensated through a series-connected inductance with the inductance value $R_T^2 \cdot C_{Ball}$. The series-connected parasitic inductance $L_{Bond}$ is compensated through a parallel-connected parasitic capacitance with the capacitance value $L_{Bond}/T_T^2$.

Figure 7:
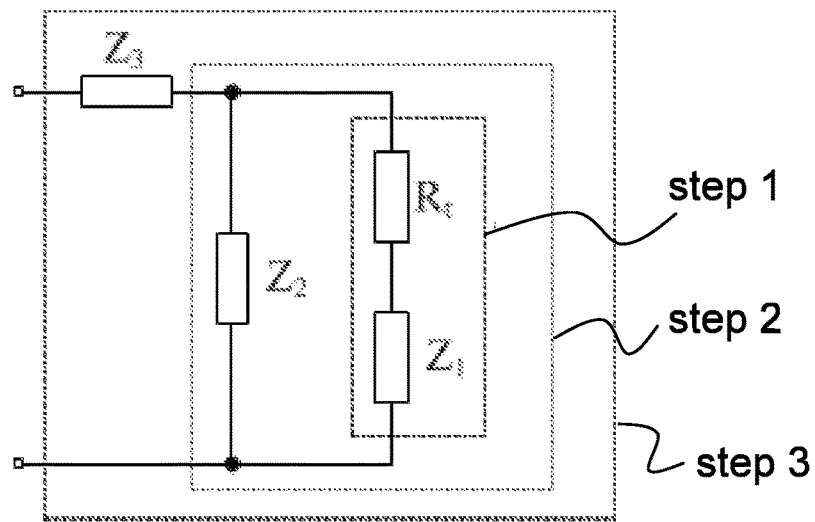
FIG. 7 an exemplary of the invention for the iterative provision of a matching circuit for a plurality of parasitic units, according to one embodiment.

FIG. 7 shows a circuit network, wherein, by way of distinction from the exemplary embodiments previously shown, several parasitic units 2 are embodied. For example, the first parasitic unit $Z_1$ can image the parasitic unit 2 shown in FIGS. 3 to 6. Furthermore, a second parasitic unit 2 is present as $Z_2$ parallel to the series configuration comprising $R_T$ and $Z_1$. Furthermore, a third parasitic unit 2 is present as $Z_3$ in series configuration to the previously named elements $Z_2$, $R_T$, $Z_1$.

Figure 8:
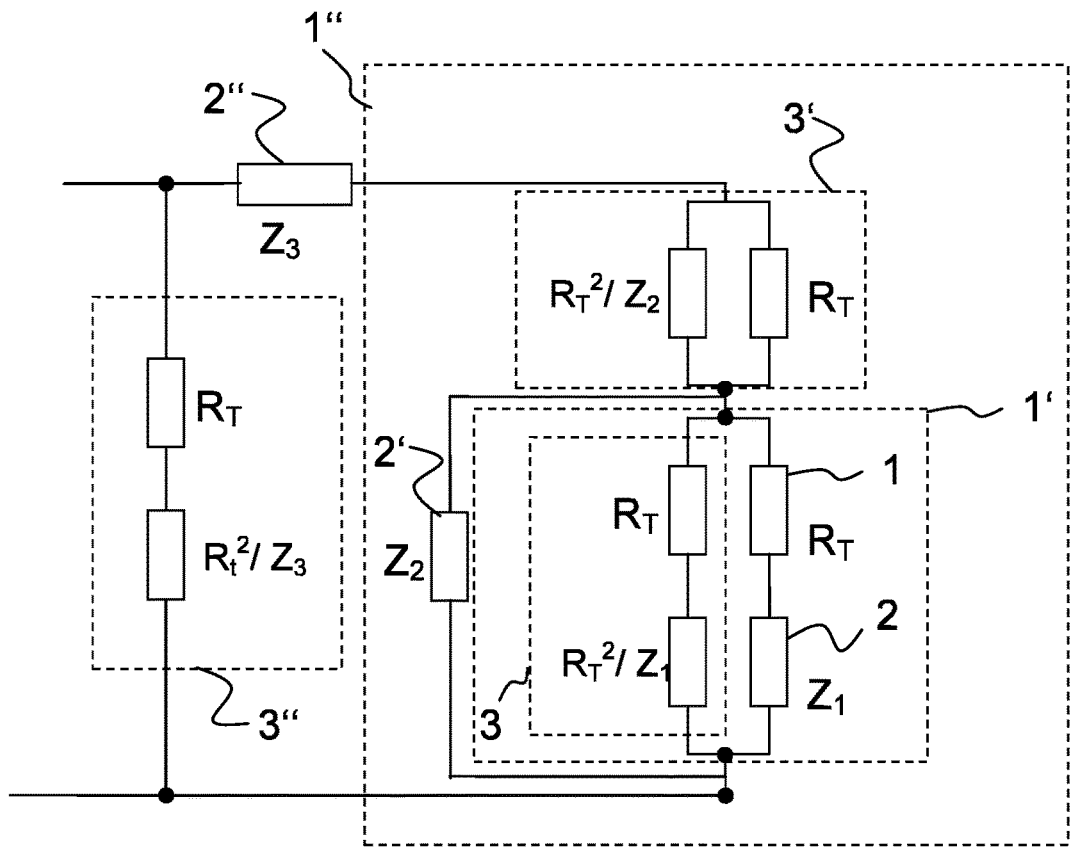
FIG. 8 a matching circuit for compensation of the parasitic units illustrated in FIG. 7, according to one embodiment.

The method according to the invention is used for the compensation of such a network, wherein the total result of the compensation is illustrated in FIG. 8.

In the method according to the invention, the presence of a parasitic unit 2 is first checked, wherein it is determined during the checking step whether the parasitic unit 2 is arranged in series configuration or in parallel configuration to an impedance element $R_T$. In the present case as shown in FIG. 7, a first parasitic unit 2 is arranged in series with an impedance element 1 with the impedance value $R_T$. For the compensation, a first compensation unit 3 is introduced, which is arranged correspondingly in parallel with the series-connected impedance element 1 and parasitic unit 2. This is shown as step 1 in FIG. 7. Since further parasitic units $Z_2$, $Z_3$ are present within the network, the method has not been completed at this point. Accordingly, a further check is performed to determine whether further parasitic units $Z_2$, $Z_3$ are present in series configuration or in parallel configuration to the now compensated impedance value. If a parasitic unit 2 is first detected in series with an impedance element 1, all parasitic units 2 disposed in series are compensated together for compensation in the first step 1. Correspondingly, in the case of a detection of a parasitic unit 2 connected in parallel to an impedance element 1, all parallel arranged parasitic units 2 are compensated together in the first step 1.

If a series configuration was compensated first, a parallel configuration of parasitic units 2 is compensated in the following step 2. Alternatively, if a parallel configuration was compensated in the preceding step 1, a series configuration is compensated in the following step 2. A series configuration and a parallel configuration therefore alternate from one compensation step to the next compensation step.

According to FIG. 7, a parasitic unit 2' with an impedance value $Z_2$ is arranged in parallel. According to FIG. 8, a compensation unit 3' which is arranged in series to a parallel configuration is introduced for the compensation. This is indicated by step 2 in FIG. 7.

The method is not yet concluded with step 2, since a third compensation element 3" is necessary in order to compensate a third parasitic unit 2" with an impedance value $Z_3$, see step 3 in FIG. 7. Because of the series configuration of $Z_3$ to the remaining circuit, a parallel configuration of a compensation unit 3" will have to be provided, see FIG. 8.

In FIG. 9*a*-FIG. 9*e*, the dual element corresponding to every conventional element of network theory is shown. The value of every dual element has been calculated on the basis of a scaling impedance $R_T$.

FIG. 9*a* shows that an ohmic resistor with a resistance value R can be compensated by a resistor with a resistance value $R_T^2/R$ as dual circuit element.

FIG. 9*b* shows that a capacitance element with a capacitance value C can be compensated by an inductance element with an inductance value $R_T^2 \cdot C$ as dual circuit element.

FIG. 9*c* shows that an inductance element with an inductance value L can be compensated by a capacitance element with a capacitance value $L/R_T^2$ as dual circuit element.

FIG. 9*d* shows that an ideal voltage source with a voltage V can be compensated by an ideal current source with a current $V/R_T$ as dual circuit element.

FIG. 9*e* shows that an ideal current source with a current I can be compensated by an ideal voltage source with a voltage $I \cdot R_T$ as dual circuit element.

FIG. 9*f* shows that a series configuration comprising two elements can be compensated by a parallel configuration of the two elements as dual circuit element.

FIG. 9*g* shows that a parallel configuration comprising two elements can be compensated by a series configuration of the two elements as dual circuit element.

FIG. 9*h* shows the dual network to a transmission line with characteristic impedance $Z_C$, which is terminated by an impedance $Z_L$. The dual network is a transmission line with characteristic impedance $R_T^2/Z_C$ which is terminated by an impedance with an impedance value $R_T^2/Z_L$. The length l and the propagation constant β of both transmission lines are identical.

All of the features illustrated, claimed or described can be combined with one another according to the invention. In particular, it is provided that networks with different parasitic units are connected to corresponding dual networks, in order to form the compensation units. Furthermore, a system comprising a first circuit unit and a second circuit unit is provided, wherein a matching circuit according to the invention is provided in order to achieve a reflection-free and power-matched signal transmission from a first circuit unit to the second circuit unit.

It is understood that, while the detailed drawings, specific examples, and particular component values given describe preferred embodiments of the present invention, they serve the purpose of illustration only. The apparatus of the invention is not limited to the precise details and conditions disclosed. Other substitutions, modifications, changes, and omissions may be made in the design, operating conditions, and arrangement of the preferred embodiments without departing from the spirit of the invention as expressed in the appended claims.

What is claimed is:

1. A matching circuit for matching an impedance value comprising:
   an impedance element with an impedance value, which corresponds to a required total impedance value of the matching circuit;
   a structurally determined parasitic unit with a parasitic impedance value; and
   a compensation unit with at least one first compensation element, wherein the first compensation element provides a compensation impedance value, which is the dual impedance value of the parasitic impedance value,
   wherein the compensation unit provides a second compensation element, and
   wherein the second compensation element provides an impedance value which corresponds to the required total impedance value.

2. The matching circuit according to claim 1,
   wherein the impedance element is arranged in series configuration with the parasitic unit, and
   wherein the compensation unit is arranged in parallel configuration to this series configuration.

3. The matching circuit according to claim 2,
   wherein the compensation unit is a series configuration comprising the first compensation element and the second compensation element.

4. The matching circuit according to claim 1,
   wherein the impedance element is arranged in parallel configuration with the parasitic unit, and
   wherein the compensation unit is arranged in series configuration to this parallel configuration.

5. The matching circuit according to claim 4,
   wherein the compensation unit is a parallel configuration comprising the first compensation element and the second compensation element.

6. The matching circuit according to claim 1,
   wherein the dual impedance value of the first compensation element is referenced to the required total impedance value.

7. The matching circuit according to claim 1,
   wherein the dual impedance value of the first compensation element is equal to the quotient of the square of the impedance value and the parasitic impedance value.

8. The matching circuit according to claim 1,
   wherein the impedance element is an ohmic resistance element, especially with an impedance value of 50 ohms.

9. The matching circuit according to claim 1,
   wherein, in each case, the parasitic unit and the first compensation element is a line with identical propagation constant and identical length.

10. The matching circuit according to claim 1,
wherein the parasitic unit is formed from a capacitance element, an inductance element and/or an ohmic resistance.

11. A system comprising a first circuit unit and a second circuit unit, wherein a matching circuit according to the claim 1 is present for the electrical matching of the first circuit unit to the second circuit unit.

12. The system according to claim 11,
wherein the second circuit unit and the matching circuit is an integral component of a measuring device, especially of a digital storage oscilloscope.

13. A method for compensating parasitic units for matching purposes with the method steps:
  checking the presence of a parasitic unit in series configuration or in parallel configuration to an impedance element, wherein the impedance element provides a required total impedance value;
  introduction of a compensation unit corresponding to the result of the checking step, wherein:
    in the presence of a parasitic unit in series configuration to the impedance element, the compensation unit is placed in parallel configuration to the series configuration; or
    in the presence of a parasitic unit in parallel configuration to the impedance element, the compensation unit is placed in series configuration to the parallel configuration;
  repetition of the checking step; and
  repetition of the placing step in the case of a presence of a further parasitic unit.

14. The method according to claim 13,
wherein the parasitic unit provides a parasitic impedance value;
wherein the compensation unit provides at least one first compensation element; and
wherein the first compensation element provides a compensation impedance value, which, in the case of a series-connected parasitic unit, is a series configuration of an impedance value and of the dual impedance value of the parasitic impedance value, or which, in the case of a parallel-connected parasitic unit, is a parallel configuration of an impedance value and of the dual impedance value of the parasitic impedance value.

* * * * *